United States Patent
Dokoutchaev et al.

(10) Patent No.: US 9,172,892 B2
(45) Date of Patent: Oct. 27, 2015

(54) IMAGING SYSTEMS WITH IMAGE PIXELS HAVING VARYING LIGHT COLLECTING AREAS

(71) Applicant: Semiconductor Components Industries, LLC, Phoenix, AZ (US)

(72) Inventors: Alexandre G. Dokoutchaev, San Jose, CA (US); Richard Holscher, Boise, ID (US); Jeffrey Mackey, Danville, CA (US); Gershon Rosenblum, Fremont, CA (US); Gennadiy Agranov, San Jose, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 28 days.

(21) Appl. No.: 13/952,290

(22) Filed: Jul. 26, 2013

(65) Prior Publication Data

US 2014/0078366 A1    Mar. 20, 2014

Related U.S. Application Data

(60) Provisional application No. 61/701,299, filed on Sep. 14, 2012.

(51) Int. Cl.
| | |
|---|---|
| H04N 9/083 | (2006.01) |
| H04N 5/225 | (2006.01) |
| H04N 5/335 | (2011.01) |
| H01L 27/146 | (2006.01) |
| H04N 5/355 | (2011.01) |
| H04N 5/369 | (2011.01) |

(52) U.S. Cl.
CPC .......... *H04N 5/335* (2013.01); *H01L 27/14627* (2013.01); *H01L 27/14667* (2013.01); *H04N 5/2254* (2013.01); *H04N 5/35563* (2013.01); *H04N 5/3696* (2013.01); *H04N 2209/045* (2013.01)

(58) Field of Classification Search
USPC .................. 348/275, 276, 277, 340, 273, 280
See application file for complete search history.

(56) References Cited

U.S. PATENT DOCUMENTS

| | | | |
|---|---|---|---|
| 5,727,242 A | 3/1998 | Lo et al. | |
| 6,137,100 A * | 10/2000 | Fossum et al. | ............. 250/208.1 |
| 6,278,847 B1 | 8/2001 | Gharib et al. | |
| 6,867,549 B2 * | 3/2005 | Cok et al. | ................... 315/169.3 |
| 7,742,088 B2 * | 6/2010 | Shizukuishi | .................. 348/272 |
| 7,768,569 B2 * | 8/2010 | Kozlowski | .................... 348/340 |

(Continued)

OTHER PUBLICATIONS

A. Portnoy et al., "Design and characterization of thin multiple aperture infrared cameras", Applied Optics, Apr. 10, 2009, vol. 48, No. 11.

*Primary Examiner* — Ngoc-Yen Vu
(74) *Attorney, Agent, or Firm* — Treyz Law Group; Michael H. Lyons

(57) ABSTRACT

An image sensor may have an array of image sensor pixels having varying light collecting areas. The light collecting area of each image pixel may vary with respect to other image pixels due to varied microlens sizes and varied color filter element sizes throughout the array. The light collecting area may vary within unit pixel cells and the variability of the light collecting areas of pixels within each pixel cell may depend on the location of the pixel cell in the pixel array. Each unit pixel cell may include at least one clear pixel having a light collecting area that is smaller than the light collecting areas of other single color pixels in the unit pixel cell.

16 Claims, 4 Drawing Sheets

(56) References Cited

U.S. PATENT DOCUMENTS

| | | |
|---|---|---|
| 7,773,137 B2 * | 8/2010 | Inoue .......................... 348/277 |
| 8,405,748 B2 * | 3/2013 | Mao et al. .................... 348/278 |
| 8,648,948 B2 * | 2/2014 | Rafferty et al. ............... 348/308 |
| 8,742,309 B2 * | 6/2014 | Agranov et al. ........... 250/208.1 |
| 2004/0105021 A1 * | 6/2004 | Hu ............................... 348/272 |
| 2004/0218291 A1 | 11/2004 | Fiete |
| 2005/0128596 A1 * | 6/2005 | Li et al. ........................ 359/619 |
| 2008/0225420 A1 | 9/2008 | Barrows et al. |

* cited by examiner

IMAGING SYSTEMS WITH IMAGE PIXELS HAVING VARYING LIGHT COLLECTING AREAS

This application claims the benefit of provisional patent application No. 61/701,299, filed Sep. 14, 2012, which is hereby incorporated by reference herein in its entirety.

BACKGROUND

This relates generally to imaging systems, and more particularly, to imaging systems with image pixels having variable light collecting areas.

Image sensors are commonly used in electronic devices such as cellular telephones, cameras, and computers to capture images. In a typical arrangement, an electronic device is provided with an array of image pixels arranged in pixel rows and pixel columns. Circuitry is commonly coupled to each pixel column for reading out image signals from the image pixels.

Conventional imaging systems include an image sensor in which the visible light spectrum is sampled by red, green, blue, clear, or other colored image pixels having a light collecting areas of a common size. In some situations, pixels of one color may saturate due to bright lights while nearby pixels of another color have not yet received enough image light to reach an acceptable signal-to-noise ratio. This can be particularly problematic in imaging systems with clear or nearly clear image pixels that receive light in a wide range of wavelengths in comparison with nearby single color pixels such as red and blue pixels.

It would therefore be desirable to be able to improved imaging systems with clear pixels.

DETAILED DESCRIPTION

Electronic devices such as digital cameras, computers, cellular telephones, and other electronic devices include image sensors that gather incoming light to capture an image. The image sensors may include arrays of image pixels. The pixels in the image sensors may include photosensitive elements such as photodiodes that convert the incoming light into electric charge. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
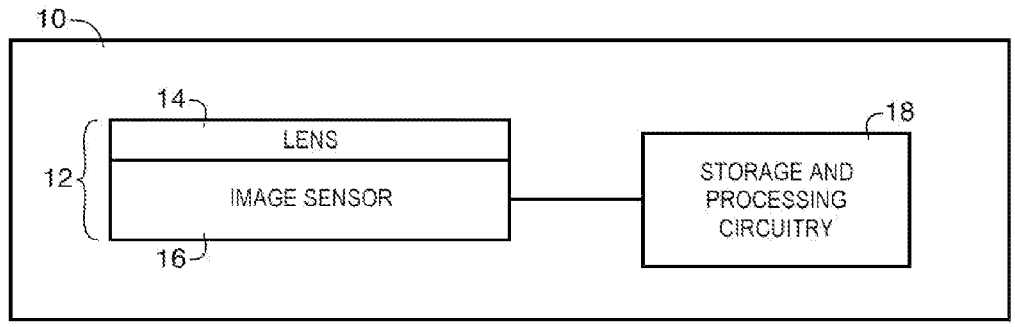
FIG. 1 is a diagram of an illustrative imaging system in accordance with an embodiment of the present invention.

FIG. 1 is a diagram of an illustrative imaging system. Imaging system 10 of FIG. 1 may be a portable electronic device such as a camera, a cellular telephone, a video camera, or other imaging device that captures digital image data. System 10 may include camera module 12 for converting incoming light into digital image data. Camera module 12 may include one or more lenses 14 and one or more corresponding image sensors 16. During image capture operations, light from a scene may be focused onto image sensor 16 by lens 14. Image sensor 16 may include one or more arrays of image sensor pixels that having photosensitive elements such as photodiodes that convert light into electric charge. Image sensor 16 may include circuitry for reading out image signals that are proportional to the accumulated electric charge and for converting the image signals into corresponding digital image data. Digital image data may be provided to processing circuitry such as storage and processing circuitry 18. If desired, camera module 12 may be provided with an array of lenses 14 and an array of corresponding image sensors 16.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
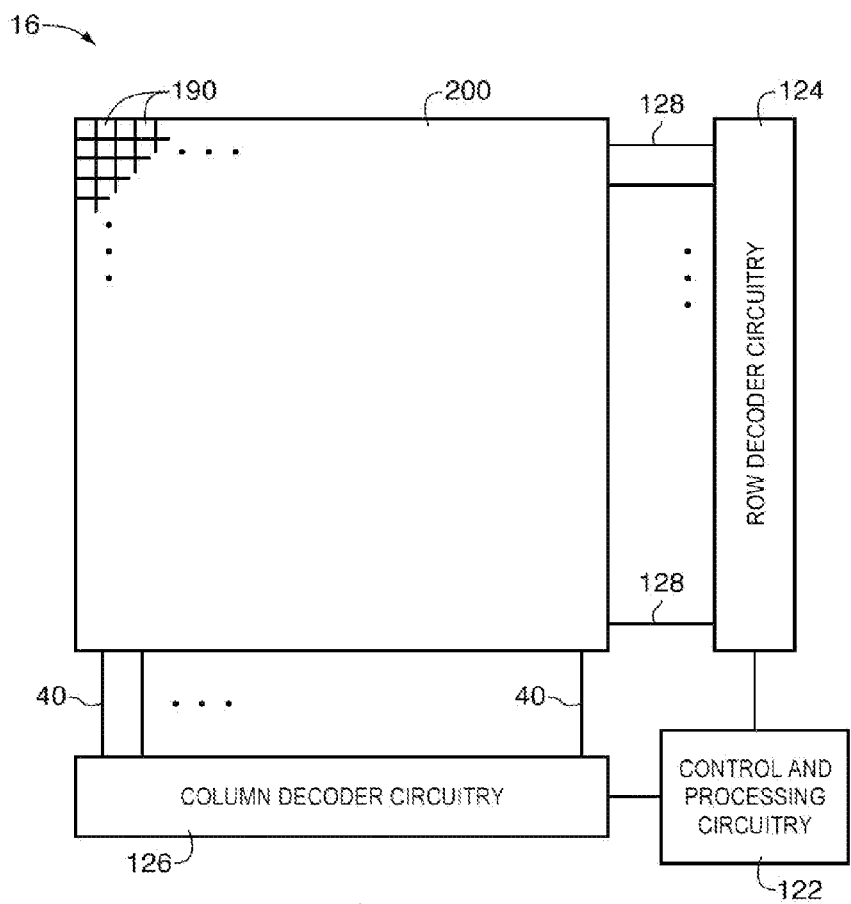
FIG. 2 is a diagram of an illustrative pixel array and associated control circuitry in accordance with an embodiment of the present invention.

As shown in FIG. 2, image sensor 16 may include an array of image pixels such as image pixel array 200 containing image sensor pixels 190 (sometimes referred to herein as image pixels or pixels) and control and processing circuitry 122. Array 200 may contain, for example, hundreds or thousands of rows and columns of image sensor pixels 190. Control circuitry 122 may be coupled to row decoder circuitry 124 and column decoder circuitry 126. Row decoder circuitry 124 may receive row addresses from control circuitry 122 and supply corresponding row control signals such as reset, row-select, transfer, and read control signals to pixels 190 over control paths 128. One or more conductive lines such as column lines 40 may be coupled to each column of pixels 190 in array 200. Column lines 40 may be used for reading out image signals from pixels 190 and for supplying bias signals (e.g., bias currents or bias voltages) to pixels 190. During pixel readout operations, a pixel row in array 200 may be selected using row decoder circuitry 124 and image data associated with image pixels 190 in that pixel row can be read out along column lines 40.

Column decoder circuitry 126 may include sample-and-hold circuitry, amplifier circuitry, analog-to-digital conversion circuitry, bias circuitry, column memory, latch circuitry for selectively enabling or disabling the column circuitry, or other circuitry that is coupled to one or more columns of pixels in array 200 for operating pixels 190 and for reading out image signals from pixels 190. Column decoder circuitry 126 may be used to selectively provide power to column circuitry on a selected subset of column lines 40. Readout circuitry such as signal processing circuitry associated with column decoder circuitry 126 (e.g., sample-and-hold circuitry and analog-to-digital conversion circuitry) may be used to supply digital image data to processor 18 (FIG. 1).

Figure 3:
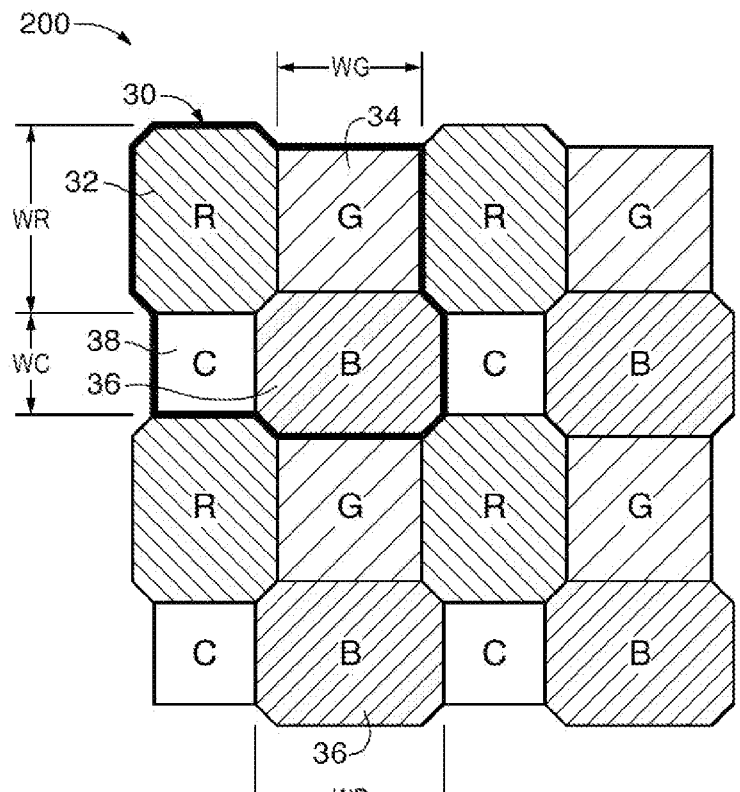
FIG. 3 is a top view of a portion of an illustrative image pixel array having unit pixel cells each having a clear image pixel, a red image pixel, a green image pixel, and a blue image pixel in which the light collecting area of each image pixel is different in accordance with an embodiment of the present invention.

Image sensor pixels 190 may be color image pixels (e.g., image pixels that include color filter elements that filter the light that passes onto each associated image pixel) with varying light collecting areas. As shown in the top view of pixel array 200 of FIG. 3, image pixel array 200 may be formed from repeating unit pixel cells 30 each having a red (R) image pixel 32, a green (G) image pixel 34, a (B) blue image pixel 36, and a clear (C) image pixel 38. As shown in FIG. 3, as seen from above, each image pixel in each cell 30 may have a light collecting area that corresponds to the color of that image pixel. The light collecting area of each image pixel may be determined by the arrangement of color filter elements and microlenses for that image pixel.

Each image pixel may have a light collecting area with a characteristic size. For example, red pixels 32 may have a maximum lateral width WR, blue pixels 36 may have a maximum lateral width WB, green pixels 34 may have a maximum lateral width WG, and clear pixels 38 may have a maximum lateral width WC. Blue pixels 36 and red pixels 32 may be asymmetrically shaped so that width WB is larger than an orthogonal width of blue pixels 36 and width WR is larger than an orthogonal width of red pixels 32. Blue pixels 36 and red pixels 32 may each have a non-rectangular shape having multiple angled edges at each corner.

Clear pixels 38 may be substantially rectangular or square shaped pixels. Green pixels 34 may be substantially rectangular or square shaped pixels. Width WC (and the corresponding light collecting area) of clear pixels 38 may be smaller than the lateral width (and corresponding light collecting area) of color pixels of other colors since clear pixels 38 absorb light of more wavelengths than single color pixels such as pixels 32, 34, and 36. Green pixels 34 may have a width WG that is larger than width WC and smaller than widths WB and/or WR. This is because common light sources produce more green light than other colors of light and green color pixels 34 may absorb more light that red pixels 32 and blue pixels 36, but less light than clear pixels 38. In this way, the amount of light that is received by pixels of each color can be balanced by the size of the light collecting area of the pixel.

The color filter pattern of FIG. 3 is merely illustrative. If desired, color pixels of other colors (e.g., cyan, magenta, yellow, infrared, etc.) may be used. The light collecting area of each pixel may be configured based on the color of that pixel.

Figure 4:
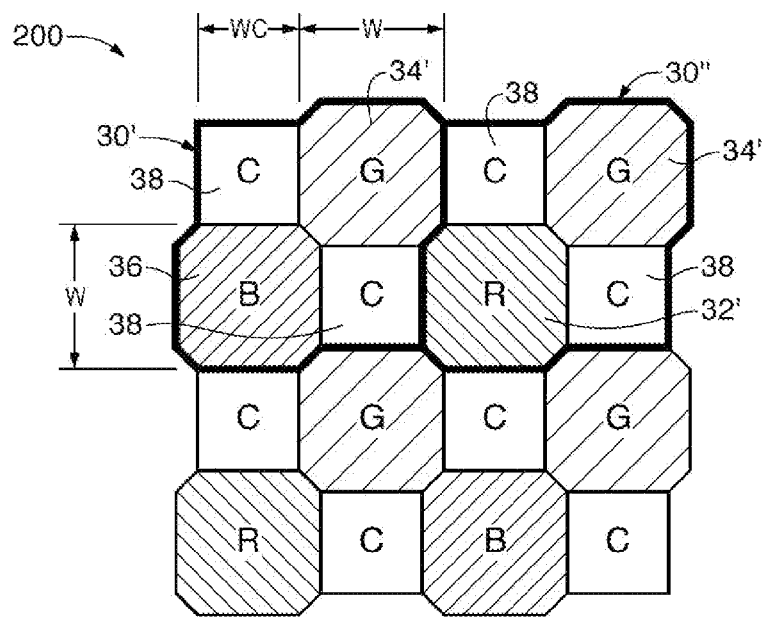
FIG. 4 is a top view of a portion of an illustrative image pixel array having unit pixel cells each having two clear image pixels in which the light collecting area of each clear image pixel is smaller than the light collecting area of other color image pixels in accordance with an embodiment of the present invention.

In another suitable example, array 200 may include alternating unit pixels cells 30' and 30" as shown in FIG. 4. Each pixel cell 30' may include two clear pixels 38, a green pixel 34', and a blue pixel 36'. Each pixel cell 30" may include two clear pixels 38, a green pixel 34', and a red pixel 32'. In the example of FIG. 4, clear pixels 38 each have a width WC and a substantially square shape. Red pixels 32', green pixels 34', and blue pixels 36' have symmetrical shapes and substantially equal widths WR' and WB' respectively. Widths WR' and WB' are larger than width WC so that the light collecting area of red pixels and blue pixels is larger than the light collecting area of clear pixels.

The variability in light collecting area from pixel to pixel may be between 1% and 30%, between 10% and 30%, between 5% and 15%, between 10% and 20%, less than 40%, less than 30%, more than 10%, more than 5%, or between 5% and 30% (as examples). Varying the light collecting area of image pixels in array 200 may also help reduce optical cross talk between clear pixels and adjacent color pixels.

Figure 5:
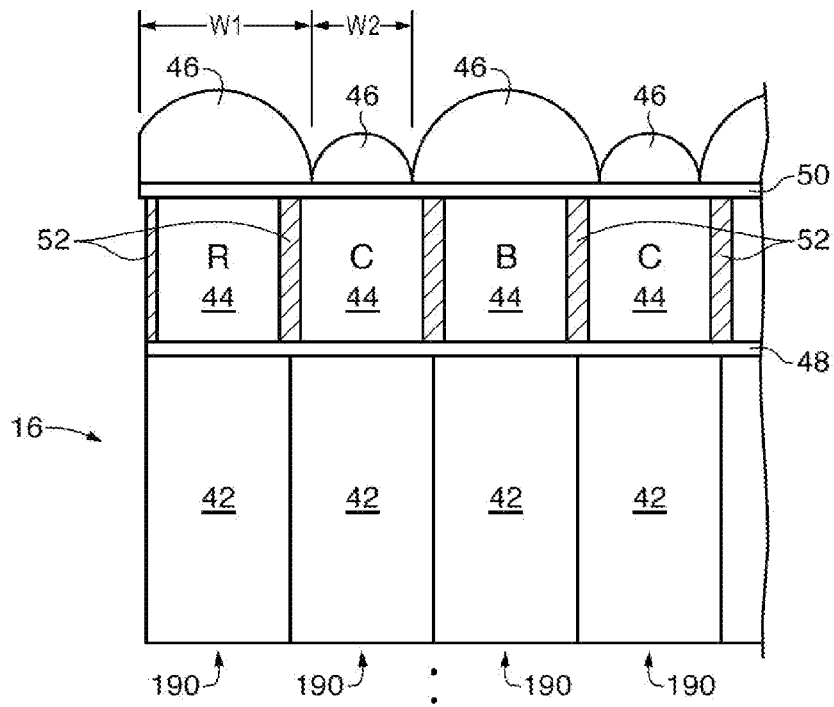
FIG. 5 is a cross-sectional view of a portion of an illustrative image pixel array showing how microlenses of varying size may be used to provide variable light collecting areas for image pixels in the image pixel array in accordance with an embodiment of the present invention.

FIG. 5 is a cross-sectional view of a portion of array 200 showing how image pixels 190 may each have a corresponding color filter element and a corresponding microlens. As shown in FIG. 5, each pixel 190 may include a photosensitive element 42 that is covered by a corresponding color filter element 44 and a corresponding microlens 46. Microlenses 46 focus image light through color filter elements 44 onto photosensitive elements (e.g., photodiodes) 42. Color filter elements 44 filter the light that passes onto photosensitive elements 42, thereby forming color pixels 190. Red image pixels such as red image pixels 32 (see FIG. 3) may include red color filter elements 44. Blue image pixels such as blue image pixels 36 and 36' (see FIGS. 3 and 4) may include blue color filter elements 44. Clear image pixels such as clear image pixels 38 (see FIGS. 3 and 4) may include clear color filter elements 44 (e.g., oxide material that passes light having red, green, and blue wavelengths). Green image pixels such as green image pixels 34 (see FIG. 3) may include green color filter elements (not shown).

As shown in FIG. 5, color filter elements 44 may have a common size. Microlenses 46 may have varying sizes that form the varying light collecting areas of pixels 190. For example, microlenses 46 of red color pixels and blue color pixels may have a characteristic width W1 that is larger than the characteristic width W2 of clear pixels. Image sensor 16 may include one or more planarization layers such as planarization layer 50 between microlenses 46 and color filter elements 44. Image sensor 16 may include additional layers such as anti-reflection stack 48 (e.g., a silicon nitride layer, an oxide layer, a high-k dielectric layer, or other suitable layers) formed between color filter elements 44 and a silicon substrate in which photosensors 42 are formed.

If desired, color filter barrier structures 52 may be formed between adjacent color filter elements 44. This type of color filter barrier may help prevent optical cross talk. However, this is merely illustrative. If desired, color filter elements 44 may be provided without any intervening barriers.

Color filter elements 44 may form an array of color filter elements over an array of photosensors 42 and under an array of microlenses 46 that form image pixel array 200. However, the arrangement of FIG. 5 in which color filter elements 44 have a common size is merely illustrative. If desired, color filter elements 44 may have varying size in order to further control the light collecting area of each image pixel 190 as shown in FIG. 6.

Figure 6:
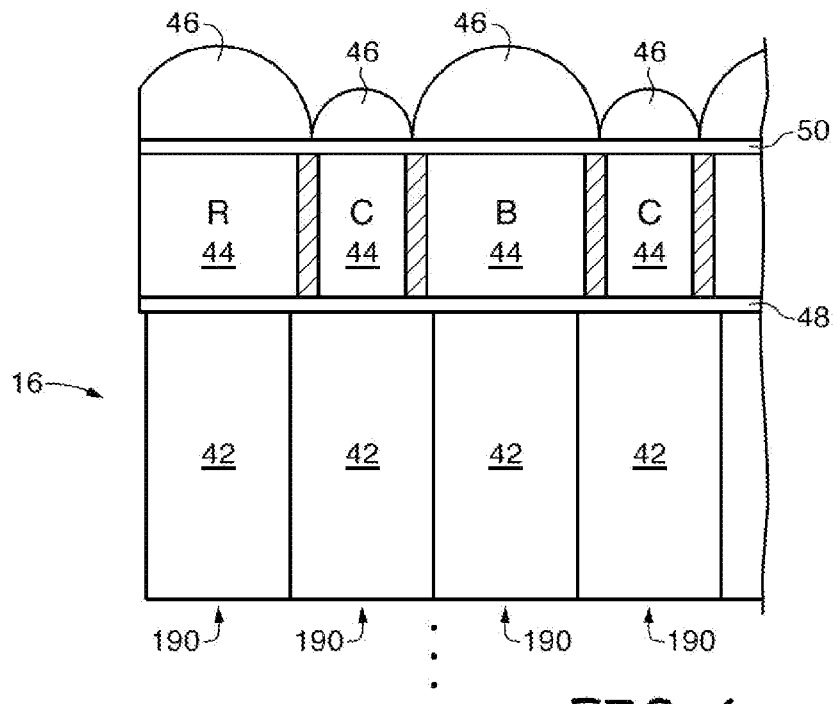
FIG. 6 is a cross-sectional view of a portion of an illustrative image pixel array showing how microlenses and color filter elements of varying size may be used to provide variable light collecting areas for image pixels in the image pixel array in accordance with an embodiment of the present invention.

As shown in FIG. 6, color filter elements 44 may have a size that corresponds to the color of the image pixel in which the color filter element is located. In the example of FIG. 6, each color filter element 44 has a characteristic width that is the same as the characteristic width of its corresponding microlens. In this way, the light collecting area of each pixel 190 may vary within a unit pixel cell due to both microlenses of various sizes and shapes within the pixel cell and color filter elements of various sizes and shapes within the pixel cell. However, the example of FIG. 6 in which the widths of microlenses 46 and the widths of corresponding color filter elements 44 are the same is merely illustrative. If desired, color filter elements 44 and microlenses 46 may be provided with any suitable shape and size for balancing the relative light sensitivity of pixels of varying color within each pixel cell.

Figure 7:
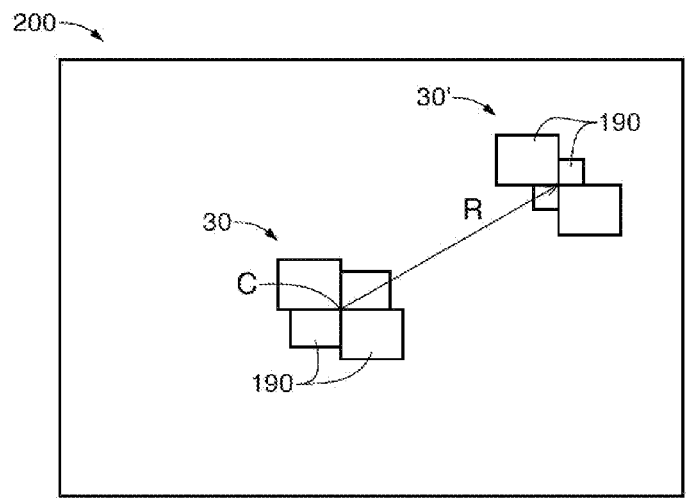
FIG. 7 is a diagram of an illustrative image pixel array showing how the variance in light collecting area of image pixels in a unit pixel cell may depend on the location of the pixel cell in the image pixel array in accordance with an embodiment of the present invention.

As shown in FIG. 7, the extent to which the light collecting area of pixels within a pixel cell varies can also vary depending on the location of the pixel cell in a pixel array. In the example of FIG. 7, a pixel cell 30 near the center C of array 200 has pixels 190 with light collecting areas of various size depending on the color of each pixel. A different pixel cell 30 located at a distance R from center C of array 200 may also have pixels 190 with light collecting areas of various size depending on the color of each pixel. However, the variance in the sizes in the pixel cell at a distance R from center C may be higher than the variance in the sizes in the pixel cell located near the center. For example, the ratio of the light collecting area of a red pixel to a clear pixel in the cell near center C may be smaller than the ratio of the light collecting area of a red pixel to a clear pixel in the cell located at a distance R from center C.

The increase in variance in light collecting area may be proportional to the distance R, may have another dependence on distance R, or may be otherwise dependent on the location of a particular pixel cell in array 200. In this way the varying size of light collection areas may be used to compensate for other effects such as lens shading near the edge of an array.

Figure 8:
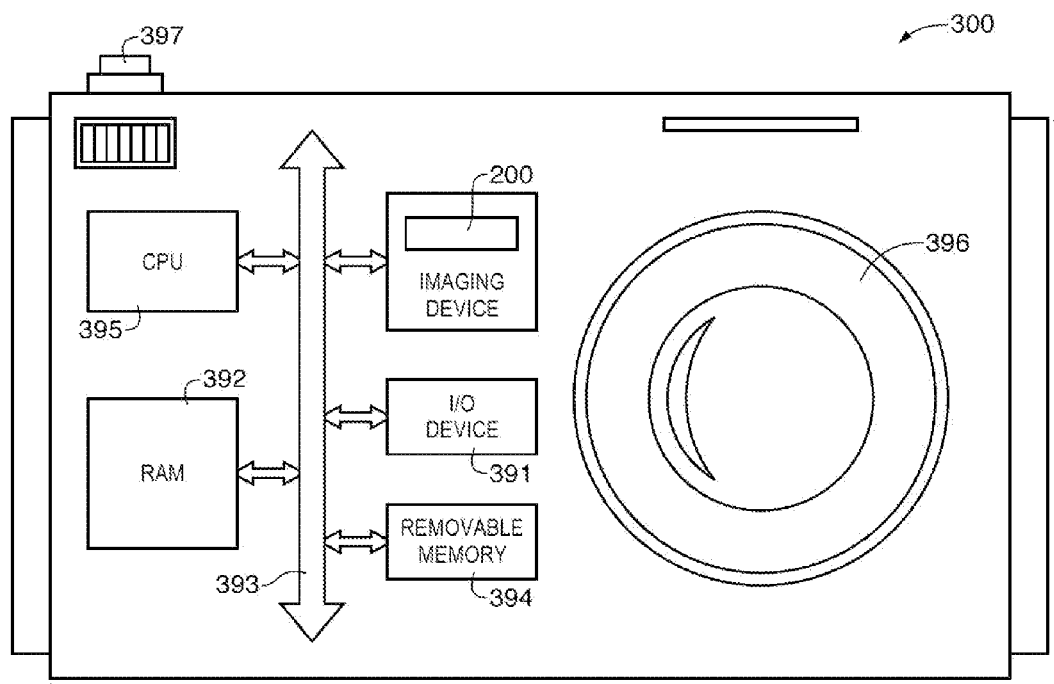
FIG. 8 is a block diagram of a processor system that may employ the embodiments of FIGS. 1-7 in accordance with an embodiment of the present invention.

FIG. 8 shows in simplified form a typical processor system 300, such as a digital camera, which includes an imaging device 2000 (e.g., an image sensor having a pixel array 200 having pixels of varying light collecting area). The processor system 300 is exemplary of a system having digital circuits that could include imaging device 2000. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The processor system 300 generally includes a lens 396 for focusing an image on pixel array 200 of device 2000 when a shutter release button 397 is pressed, central processing unit (CPU) 395, such as a microprocessor which controls camera and one or more image flow functions, which communicates with one or more input/output (I/O) devices 391 over a bus 393. Imaging device 2000 also communicates with the CPU 395 over bus 393. The system 300 also includes random access memory (RAM) 392 and can include removable memory 394, such as flash memory, which also communicates with CPU 395 over the bus 393. Imaging device 2000 may be combined with the CPU, with or without memory storage on a single integrated circuit or on a different chip. Although bus 393 is illustrated as a single bus, it may be one or more busses or bridges or other communication paths used to interconnect the system components.

Various embodiments have been described illustrating image sensors having arrays of image pixels that have varying light collecting areas. The light collecting area of each image pixel may be varied with respect to other image pixels using variable microlens sizes and/or variable color filter element sizes throughout the array. The light collecting area may vary with unit pixel cells. For example, a unit pixel cell may include a red pixel, a blue pixel, a green pixel, and a clear pixel in which the clear pixel has the smallest light collecting area, the green pixel has a relatively larger light collecting area, and the red and blue pixels have larger light collecting areas still. In another example, a unit pixel cell may include two clear pixels and other color pixels in which the clear pixels have a common light collecting area size that is smaller than the size of the light collecting area of the other color pixels.

The variability of the light collecting areas of pixels within each pixel cell may depend on the location of the pixel cell in the pixel array.

The foregoing is merely illustrative of the principles of this invention which can be practiced in other embodiments.

What is claimed is:

1. An image sensor, comprising:
an array of image pixels in which each image pixel in a first set of image pixels includes a microlens having a first common size and each image pixel in a second set of image pixels includes a microlens having a second common size that is different from the first common size, wherein each image pixel in the first and second sets of image pixels includes a color filter element having a common size.

2. The image sensor defined in claim 1 wherein the color filter element of at least one of the first set of image pixels comprises a clear color filter element.

3. The image sensor defined in claim 2 wherein the color filter element of at least one of the second set of image pixels comprises a red color filter element.

4. The image sensor defined in claim 3 wherein the first common size is smaller than the second common size.

5. The image sensor defined in claim 4 wherein the first common size is at least ten percent smaller in area than the second common size.

6. The image sensor defined in claim 4 wherein the color filter element of at least one additional one of the second set of image pixels comprises a blue color filter element.

7. The image sensor defined in claim 6 wherein the array of image pixels further includes a third set of image pixels each having a microlens having a third common size that is different from the first common size and the second common size.

8. The image sensor defined in claim 7 wherein each image pixel in the third set of image pixels includes a green color filter element.

9. The image sensor defined in claim 8 wherein the third common size is smaller than the second common size and larger than the first common size.

10. An image sensor, comprising:
an array of image pixels that includes at least one unit pixel cell having a first image pixel of a first color with a first microlens having a first microlens size and a second image pixel of a second color with a second microlens having a second microlens size, wherein the first image pixel includes a first color filter element of the first color having a first color filter size and wherein the second image pixel includes a second color filter element of the second color having a second color filter size, wherein the first microlens size and the second microlens size have a first microlens ratio, the array of image pixels further includes a first additional unit pixel cell having a first additional image pixel of the first color with a first additional microlens having a first additional microlens size and a second additional image pixel having the second color and a second additional microlens with a second additional microlens size, and the first additional microlens size and the second additional microlens size have a second microlens ratio that is different from the first microlens ratio; and a color filter barrier structure interposed between the first and second color filter elements.

11. The image sensor defined in claim 10 wherein the at least one unit pixel cell includes a third image pixel of a third color with a third microlens having the first microlens size.

12. The image sensor defined in claim 11 wherein the third image pixel includes a third color filter element of the third color having the first color filter size.

13. The image sensor defined in claim 12 wherein the at least one unit pixel cell includes a fourth image pixel of a fourth color with a fourth microlens having a third microlens size.

14. The image sensor defined in claim 13 wherein the fourth image pixel includes a fourth color filter element of the fourth color having a third color filter size.

15. The image sensor defined in claim 12 wherein the at least one unit pixel cell includes a fourth image pixel of the second color with a fourth microlens having the second microlens size.

16. The image sensor defined in claim 15 wherein the fourth image pixel includes a fourth color filter element of the fourth color having the second color filter size.

* * * * *